US012400830B2

(12) United States Patent
Nauman et al.

(10) Patent No.: US 12,400,830 B2
(45) Date of Patent: Aug. 26, 2025

(54) RF SPUTTERING OF MULTIPLE ELECTRODES WITH OPTIMIZED PLASMA COUPLING THROUGH THE IMPLEMENTATION OF CAPACITIVE AND INDUCTIVE COMPONENTS

(71) Applicants: Bühler AG, Uzwil (CH); Advanced Energy Industries, Inc., Fort Collins, CO (US)

(72) Inventors: Ken Nauman, Fort Collins, CO (US); Masahiro Watanabe, Windsor, CO (US); Sarah Williams, Fort Collins, CO (US); Michael S. Thornton, Loveland, CO (US); Michael Meyer, Windsor, CO (US)

(73) Assignees: Bühler AG, Uzwil (CH); Advanced Energy Industries, Inc, Fort Collins, CO (US)

( * ) Notice: Subject to any disclaimer, the term of this patent is extended or adjusted under 35 U.S.C. 154(b) by 177 days.

(21) Appl. No.: 18/366,437

(22) Filed: Aug. 7, 2023

(65) Prior Publication Data

US 2025/0054728 A1    Feb. 13, 2025

(51) Int. Cl.
*H01J 37/32* (2006.01)
*H01J 37/18* (2006.01)
*H01J 37/34* (2006.01)

(52) U.S. Cl.
CPC ........ *H01J 37/32183* (2013.01); *H01J 37/18* (2013.01); *H01J 37/32568* (2013.01); *H01J 37/3408* (2013.01)

(58) Field of Classification Search
CPC ................ H01J 37/32183; H01J 37/18; H01J 37/32568; H01J 37/3408; H01J 37/3405; H01J 37/3444
See application file for complete search history.

(56) References Cited

U.S. PATENT DOCUMENTS 6,248,219 B1   6/2001   Wellerdieck et al.
6,258,217 B1   7/2001   Richards et al.
(Continued)

FOREIGN PATENT DOCUMENTS

CN    115074680 A    9/2022
JP    2023083647 A   6/2023

OTHER PUBLICATIONS

International Searching Authority, "International Search Report and Written Opinion", dated Nov. 6, 2024, from PCT Application No. PCT/US2024/040831, from Foreign Counterpart to U.S. Appl. No. 18/366,437, pp. 1 through 9, Published: WO.

*Primary Examiner* — Renan Luque

(74) *Attorney, Agent, or Firm* — Fogg & Powers LLC

(57) ABSTRACT

An apparatus comprises a vacuum chamber configured to produce a substantially atmospheric vacuum environment for plasma processing; a radio frequency (RF) power supply located outside of the vacuum chamber; an RF matching network operatively coupled to the RF power supply; and a plurality of electrodes mounted within the vacuum chamber, the plurality of electrodes configured to receive RF power signals from the RF power supply through the RF matching network. The RF power signals are simultaneously delivered to the plurality of electrodes during a sputtering operation. The plurality of electrodes and a set of electrical components are operative to manage the inductive and capacitive reactance for coupling the RF power signals to provide more desirable plasma coupling during the sputtering operation.

20 Claims, 2 Drawing Sheets

(56) References Cited

U.S. PATENT DOCUMENTS

| | | |
|---|---|---|
| 9,281,436 B2 | 3/2016 | Xie et al. |
| 10,163,611 B2 | 12/2018 | De Bosscher et al. |
| 10,699,885 B2 | 6/2020 | Crowley et al. |
| 2013/0008777 A1 | 1/2013 | Choquette et al. |
| 2015/0376774 A1 | 12/2015 | Ryuichi et al. |
| 2018/0108520 A1* | 4/2018 | Pelleymounter .... C23C 14/3485 |
| 2020/0176234 A1* | 6/2020 | Abraham .............. C23C 14/345 |
| 2021/0005429 A1* | 1/2021 | Tanabe .............. H01J 37/32532 |
| 2022/0093363 A1* | 3/2022 | Romanus ............ H01J 37/3405 |
| 2022/0098724 A1 | 3/2022 | Wenz et al. |

* cited by examiner

RF SPUTTERING OF MULTIPLE ELECTRODES WITH OPTIMIZED PLASMA COUPLING THROUGH THE IMPLEMENTATION OF CAPACITIVE AND INDUCTIVE COMPONENTS

BACKGROUND

Magnetron sputtering of target materials is well known and used extensively for producing a wide variety of thin films on various substrates. In magnetron sputtering, the material to be sputtered is either formed on a planar or tubular target structure. A magnetron assembly is disposed adjacent to or within the target structure and supplies a magnetic field such that there is adequate magnetic flux at the outer surface of the target structure for the sputtering process.

Planar magnetron radio frequency (RF) sputtering of target materials is a known technique. For example, a sputtering method involving simultaneous application of direct current (DC) power and RF power has been developed, in which superposition of the two power sources is used for a planar target structure. In addition, multiple connections for single, rotatable magnetron RF sputtering of target materials is also known.

The RF magnetron sputtering implemented in current systems either utilizes smaller, lab scale magnetrons, or planar magnetrons, and is limited by the non-uniformity of the deposited layer. For example, the application of RF power to a rotary cathode can result in an unacceptable non-uniformity of the deposited thin film thickness.

Accordingly, there is a need for improving the application of RF power to rotary sputtering cathodes that addresses the issue of non-uniformity of deposited thin films.

SUMMARY

An apparatus comprises a vacuum chamber configured to produce a substantially atmospheric vacuum environment for plasma processing; a radio frequency (RF) power supply located outside of the vacuum chamber; an RF matching network operatively coupled to the RF power supply; and a plurality of electrodes mounted within the vacuum chamber, the plurality of electrodes configured to receive RF power signals from the RF power supply through the RF matching network. The RF power signals are simultaneously delivered to the plurality of electrodes during a sputtering operation. The plurality of electrodes and a set of electrical components are operative to manage the inductive and capacitive reactance for coupling the RF power signals to provide optimized plasma coupling during the sputtering operation.

BRIEF DESCRIPTION OF THE DRAWINGS

Features of the present invention will become apparent to those skilled in the art from the following description with reference to the drawings. Understanding that the drawings depict only typical embodiments and are not therefore to be considered limiting in scope, the invention will be described with additional specificity and detail through the use of the accompanying drawings, in which.

DETAILED DESCRIPTION

Figure 1:
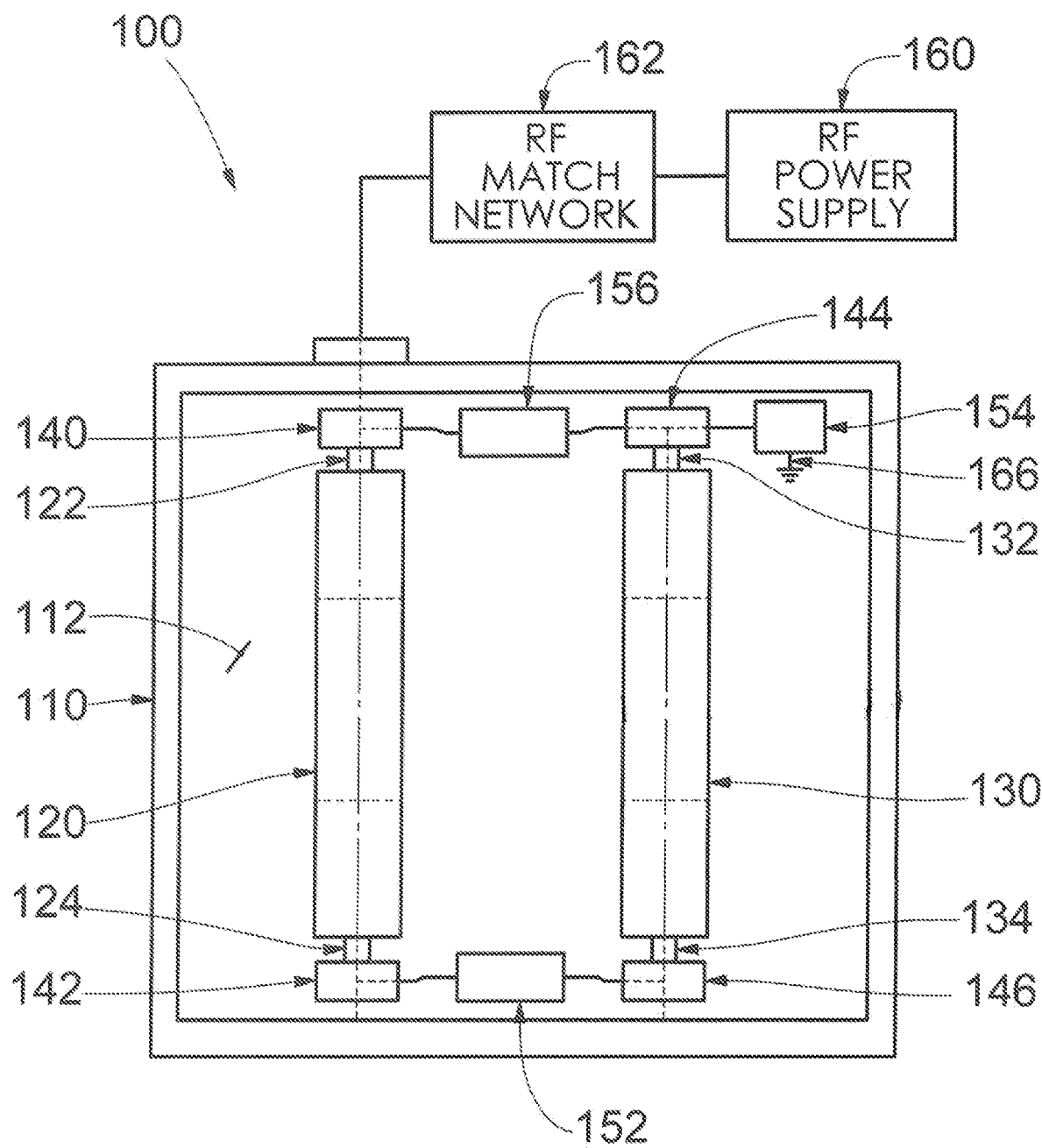
FIG. 1 is a schematic diagram of an apparatus for RF sputtering using multiple electrodes with reactive components implemented, according to one embodiment.

In the following detailed description, embodiments are described in sufficient detail to enable those skilled in the art to practice the invention. It is to be understood that other embodiments may be utilized without departing from the scope of the invention. The following detailed description is, therefore, not to be taken in a limiting sense.

Apparatus and methods for RF sputtering with optimized inductive and capacitive couplings is described herein. The present apparatus can utilize multiple electrodes such as magnetron electrodes and reactive components such as inductors and capacitors to optimize RF power coupling for sputter applications. In some embodiments, the magnetron electrodes can have magnetic fields produced by permanent magnets or by electric coils of wire.

The present approach optimizes the RF power coupling to the plasma between capacitive and inductive, which creates a more desirable impedance and power distribution. The improvement of these characteristics can produce more desirable thin film properties and deposition profile and/or rate. This is accomplished through the operating space of the apparatus configuration, which develops the desired ion energy and flux.

In one embodiment, the apparatus has a configuration of multiple electrodes utilizing multiple connections and integrates an RF matching network and any needed electrical balancing components. This ensures controllable power delivery to each magnetron electrode.

The present apparatus has the advantages of utilizing unique power couplings and allowing for modification of the coupling of the plasma. This apparatus also provides for combining multiple types of power sources such as various RF, mid-frequency AC (MF), DC, or pulsed DC. These techniques have proven useful for controlling deposition rate and film properties.

The electrodes used in the present apparatus are comprised of a material suitable for the transmission of power from DC, pulsed DC, MF, or RF power supplies. The power delivery may be in the form of sinusoidal, square waves, or other waveshapes as determined to be beneficial to the plasma process. The shape, cross section, and surface finish of the electrode will be determined by the properties required for the application. This may include mechanical strength, thermal conductivity, bonding or adhesion of target material, or other such requirements. The electrode may act as the anode, cathode, or as an isolated element in the process chamber.

To enhance the uniformity or rate of the process, the electrodes may also have magnetic field enhancements by utilizing permanent magnets or electromagnetic generated fields. Depending on their function in the circuit, the electrodes may be isolated from ground or grounded. Cooling of the electrodes may be achieved through radiation or conduction to a liquid such as water. In one embodiment, the present apparatus utilizes a rotatable magnetron as an electrode, which creates a plasma to sputter material from the target.

Further details of various embodiments are described hereafter and with reference to the drawings.

FIG. 1 illustrates an apparatus 100 for RF sputtering that manages the voltage and current, capacitive and inductive reactance, for better process and film property results, according to one embodiment. The apparatus 100 includes a vacuum chamber 110 that is configured to create a substantially atmospheric vacuum environment 112 for plasma processing. The vacuum environment 112 includes selected gases that create desired sputtering conditions and deposited material properties.

A plurality of electrodes, such as a first electrode 120 and a second electrode 130, are mounted within vacuum chamber 110 for exposure to vacuum environment 112. In some embodiments, electrodes 120 and 130 are magnetron electrodes that are rotatably mounted in series within vacuum chamber 110. For example, electrodes 120 and 130 can each comprise a rotary magnetron assembly that includes a rotatable target cylinder that houses a magnetron. In other embodiments, electrodes 120 and 130 can each comprise a planar magnetron assembly. The electrodes 120 and 130 are selected to produce desirable magnetic fields for a target material to optimize a sputtering process.

As shown in FIG. 1, the first electrode 120 has a first coupling end 122 and an opposing second coupling end 124. The second electrode 130 has a first coupling end 132 and an opposing second coupling end 134. The first coupling device 140 is in electrical communication with first electrode 120 through first coupling end 122, and a second coupling device 142 is in electrical communication with first electrode 120 through second coupling end 124. A third coupling device 144 is in electrical communication with second electrode 130 through first coupling end 132 and a fourth coupling device 146 is in electrical communication with second electrode 130 through the second coupling end 134.

In one embodiment, the first coupling device 140 can comprise a first end-block, and second coupling device 142 can comprise a second end-block. In this embodiment, first and second coupling ends 122, 124 of first electrode 120 are respectively connected to the first and second end-blocks through respective vacuum seal arrangements. In addition, the third coupling device 144 can comprise a third end-block, and fourth coupling device 146 can comprise a fourth end-block. The first and second coupling ends 132, 134 of second electrode 130 are respectively connected to the third and fourth end-blocks through respective vacuum seal arrangements. As used herein, the term "end-block" refers to a coupling device that provides one or more functions including rotation, power, bearing, rotary vacuum sealing, or rotary water sealing. The vacuum seal arrangements allow for connecting components inside and outside of vacuum chamber 110.

In one example embodiment, first coupling device 140 is a first end-block located outside of vacuum chamber 110 on a first side thereof, and second coupling device 142 is a second end-block located outside of vacuum chamber 110 on an opposing second side thereof. In this embodiment, the first electrode 120 is rotatably coupled to the first end-block through first coupling end 122 and is rotatably coupled to the second end-block through second coupling end 124. In addition, the third coupling device 144 is a third end-block located outside of vacuum chamber 110 on the first side thereof, and fourth coupling device 146 is a fourth end-block located outside of vacuum chamber 110 on the opposing second side thereof. The electrode 130 is rotatably coupled to the third end-block through first coupling end 132 and is rotatably coupled to the fourth end-block through second coupling end 134.

A plurality of electrical components 152, 154, and 156 are also utilized in apparatus 100. The electrical components 152, 154, and 156 can include one or more capacitors, inductors, or resistors, for example, which are configured to optimize power delivery to electrodes 120 and 130.

Apparatus 100 includes at least one RF power supply 160 and an RF matching network 162 coupled to RF power supply 160. The electrodes 120 and 130 are configured to receive RF power signals from RF power supply 160 through RF matching network 162. In one embodiment, RF matching network 162 is operatively coupled to electrode 120 through first coupling device 140 to provide the RF power signals to electrode 120. The electrical component 152 is coupled between the second coupling device 142 and fourth coupling device 146, such that the RF power signals are also simultaneously delivered to electrode 130.

In one embodiment, electrical component 154 is coupled between third coupling device 144 and a ground connection 166 within vacuum chamber 110. The electrical component 156 can be coupled between the first coupling device 140 and third coupling device 144.

In another embodiment, electrical component 156 can be grounded on one terminal and configured to act as an additional electrode in vacuum chamber 110. In a similar manner, electrical component 152, coupled between second coupling device 142 and fourth coupling device 146, may be configured as an electrode, such as a magnetron, designed to enhance the plasma coupling within vacuum chamber 110. This design is configured to improve the impedance, uniformity, and/or deposition rate of apparatus 100. Also, this design may require additional match network components such as capacitors or inductors to optimize the power coupling and plasma performance.

In some embodiments, electrodes 120 and 130 can each be a single, continuous electrode. In alternative embodiments, electrodes 120 and 130 can each be implemented with several discrete parts, as opposed to a single, continuous electrode.

In various embodiments, a power transfer apparatus can be employed to carry the RF power to electrodes 120 and 130. The RF power configuration manages the inductive and capacitive reactance between electrodes 120 and 130 during operation to produce a desired sputtering process. The configuration of apparatus 100 provides a power circuit that allows RF power signals to be simultaneously delivered to electrodes 120 and 130 during a sputtering operation.

Figure 2:
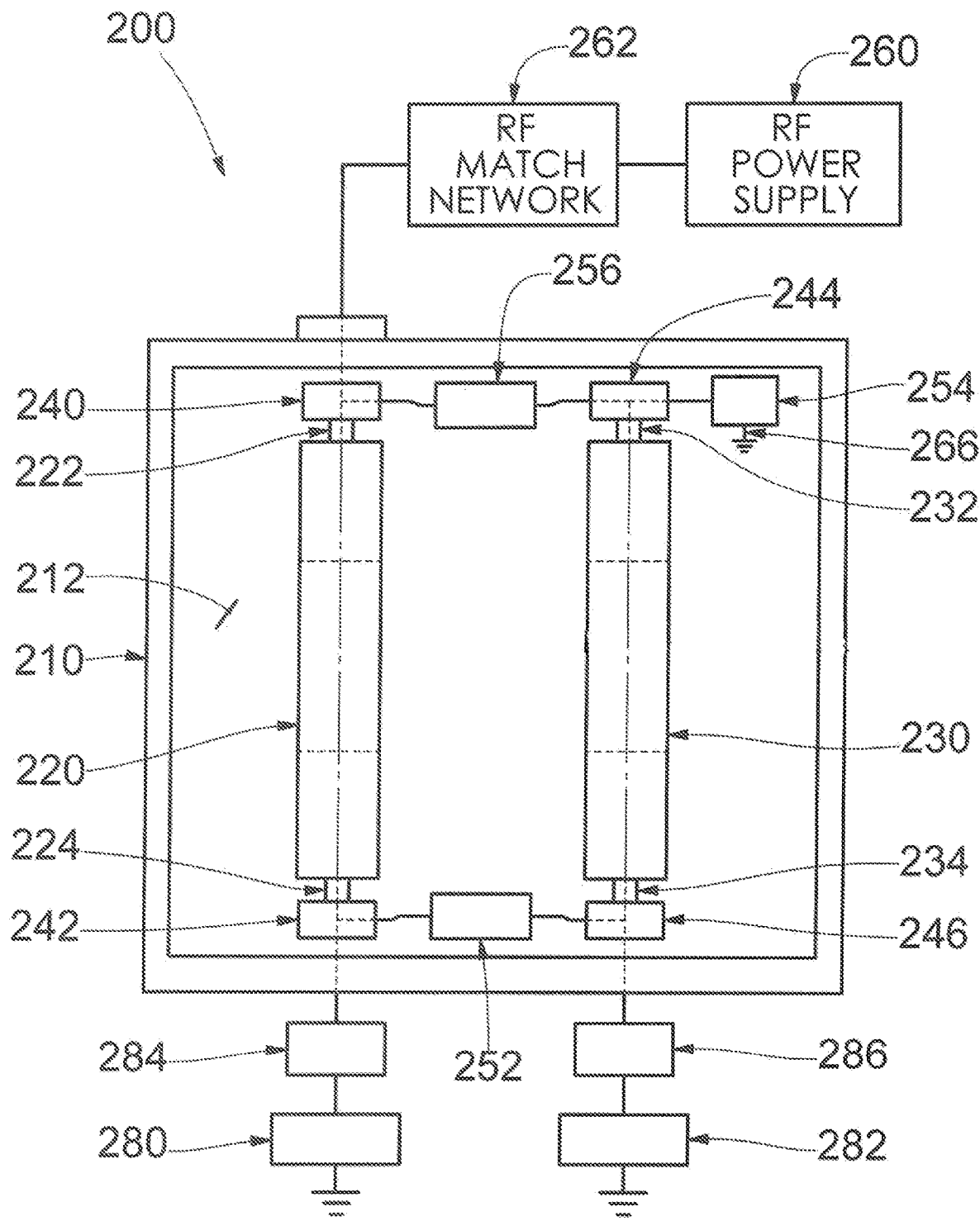
FIG. 2 is a schematic diagram of an apparatus for RF sputtering using multiple electrodes with reactive components implemented, according to another embodiment.

FIG. 2 illustrates an apparatus 200 for RF sputtering that manages the inductive and capacitive reactance in the plasma coupling, according to another embodiment. The apparatus 200 includes a vacuum chamber 210 that is configured to create a substantially atmospheric vacuum environment 212 for plasma processing.

A plurality of electrodes, such as a first magnetron electrode 220 and a second magnetron electrode 230, are mounted within vacuum chamber 210 for exposure to vacuum environment 212. In some embodiments, magnetron electrodes 220 and 230 are rotatably mounted in series within vacuum chamber 210. For example, magnetron electrodes 220 and 230 can each be comprised of a rotary magnetron cathode assembly that includes a rotatable target cylinder that houses a magnetron.

As shown in FIG. 2, first magnetron electrode 220 has a first coupling end 222 and an opposing second coupling end 224. The second magnetron electrode 230 has a first coupling end 232 and an opposing second coupling end 234.

A first coupling device 240 is in electrical communication with first magnetron electrode 220 through first coupling end 222, and a second coupling device 242 is in electrical communication with first magnetron electrode 220 through second coupling end 224. A third coupling device 244 is in electrical communication with second magnetron electrode 230 through first coupling end 232 and a fourth coupling device 246 is in electrical communication with second magnetron electrode 230 through second coupling end 234.

In one embodiment, the first coupling device 240 can comprise a first end-block, and second coupling device 242 can comprise a second end-block. In this embodiment, first and second coupling ends 222, 224 of first magnetron electrode 220 are respectively connected to the first and second end-blocks through respective vacuum seal arrangements. In addition, third coupling device 244 can comprise a third end-block, and fourth coupling device 246 can comprise a fourth end-block. The first and second coupling ends 232, 234 of second magnetron electrode 230 are respectively connected to the third and fourth end-blocks through respective vacuum seal arrangements.

In one example embodiment, first coupling device 240 is a first end-block located outside of vacuum chamber 210 on a first side thereof, and second coupling device 242 is a second end-block located outside of vacuum chamber 210 on an opposing second side thereof. In this embodiment, first magnetron electrode 220 is rotatably coupled to the first end-block through first coupling end 222 and is rotatably coupled to the second end-block through second coupling end 224. In addition, the third coupling device 244 is a third end-block located outside of vacuum chamber 210 on the first side thereof, and fourth coupling device 246 is fourth end-block located outside of vacuum chamber 210 on the opposing second side thereof. The second magnetron electrode 230 is rotatably coupled to the third end-block through first coupling end 232 and is rotatably coupled to the fourth end-block through second coupling end 234.

A plurality of electrical components 252, 254, and 256 are also utilized in apparatus 200. The electrical components 252, 254, and 256 can include one or more capacitors, inductors, or resistors, for example, which are configured to optimize power delivery to magnetron electrodes 220 and 230.

The apparatus 200 includes an RF power supply 260 and an RF matching network 262 coupled to RF power supply 260. The magnetron electrodes 220 and 230 are configured to receive RF power signals from RF power supply 260 through RF matching network 262.

In one embodiment, RF matching network 262 is operatively coupled to the first magnetron electrode 220 through first coupling device 240 to provide the RF power signals to the first magnetron electrode 220. The electrical component 252 is coupled between the second coupling device 242 and fourth coupling device 246, such that the RF power signals are also simultaneously delivered to second magnetron electrode 230.

In one embodiment, electrical component 254 is coupled between third coupling device 244 and a ground connection 266 within vacuum chamber 210. The electrical component 256 can be coupled between first coupling device 240 and third coupling device 244.

In another embodiment, electrical component 256 can be grounded on one terminal and configured to act as an additional electrode in vacuum chamber 210. In a similar manner, electrical component 252, coupled between second coupling device 242 and fourth coupling device 246, may be configured as an electrode, such as a magnetron, designed to enhance the plasma coupling within vacuum chamber 210. This design is configured to improve the impedance, uniformity, and/or deposition rate of apparatus 200. Also, this design may require additional match network components such as capacitors or inductors to optimize the power coupling and plasma performance.

In some embodiments, magnetron electrodes 220 and 230 can each be a single, continuous electrode. In alternative embodiments, magnetron electrodes 220 and 230 can each be implemented with several discrete parts, as opposed to a single, continuous electrode.

In various embodiments, a power transfer apparatus can be employed to carry the RF power to magnetron electrodes 220 and 230. The RF power provides a magnetic flux between magnetron electrodes 220 and 230 during operation to produce a desired sputtering process.

In addition, a set of low frequency or DC power supplies are located outside of vacuum chamber 210. In one embodiment, a first low frequency or DC power supply 280 is in operative communication with first magnetron electrode 220 through second coupling device 242, and a second low frequency or DC power supply 282 is in operative communication with second magnetron electrode 230 through fourth coupling device 246.

The low frequency or DC power supplies 280 and 282 are grounded and configured to modify the rate of the sputtering process, and to control the plasma and film properties. For example, mixing of the RF power signals with the low frequency or DC power signals can provide for a higher deposition rate, can modify film properties, or both. The RF power signals, and the low frequency or DC power signals, can be simultaneously delivered to magnetron electrodes 220 and 230 during a sputtering operation.

A set of filters can be respectively coupled to outputs of low frequency or DC power supplies 280 and 282 as needed. In one embodiment, a first filter 284 such as a first lowpass filter is coupled to an output of low frequency or DC power supply 280, and a second filter 286 such as a second lowpass filter is coupled to an output of low frequency or DC power supply 282. The first and second filters 284, 286 are configured to aid in combining the low frequency or DC power with the RF power delivery to magnetron electrodes 220 and 230.

The configuration of apparatus 200 provides a power circuit that allows RF power signals to be simultaneously delivered to magnetron electrodes 220 and 230 during a sputtering operation.

Example Embodiments

Example 1 includes an apparatus, comprising: a vacuum chamber configured to produce a substantially atmospheric vacuum environment for plasma processing; a radio frequency (RF) power supply located outside of the vacuum chamber; an RF matching network operatively coupled to the RF power supply; and a plurality of electrodes mounted within the vacuum chamber, the plurality of electrodes configured to receive RF power signals from the RF power supply through the RF matching network; wherein the RF power signals are simultaneously delivered to the plurality of electrodes during a sputtering operation; wherein the plurality of electrodes and a set of electrical components are operative to manage inductive and capacitive reactance for coupling the RF power signals to provide more desirable plasma coupling during the sputtering operation.

Example 2 includes the apparatus of Example 1, wherein the plurality of electrodes each comprise a rotary magnetron assembly that includes a rotatable target cylinder that houses a magnetron.

Example 3 includes the apparatus of Example 1, wherein the plurality of electrodes each comprise a planar magnetron assembly.

Example 4 includes the apparatus of any of Examples 1-2, wherein the plurality of electrodes comprise a first rotary magnetron assembly and a second rotary magnetron assembly, mounted in series within the vacuum chamber.

Example 5 includes the apparatus of Example 4, wherein: the first rotary magnetron assembly includes a first coupling end and an opposing second coupling end; and the second rotary magnetron assembly includes a first coupling end and an opposing second coupling end.

Example 6 includes the apparatus of Example 5, further comprising: a first coupling device in electrical communication with the first coupling end of the first rotary magnetron assembly; a second coupling device in electrical communication with the second coupling end of the first rotary magnetron assembly; a third coupling device in electrical communication with the first coupling end of the second rotary magnetron assembly; and a fourth coupling device in electrical communication with the second coupling end of the second rotary magnetron assembly.

Example 7 includes the apparatus of Example 6, wherein: the first coupling device comprises a first end-block, and the second coupling device comprises a second end-block; wherein the first and second coupling ends of the first rotary magnetron assembly are respectively connected to the first and second end-blocks, through respective vacuum seal arrangements.

Example 8 includes the apparatus of Example 7, wherein: the third coupling device comprises a third end-block, and the fourth coupling device comprises a fourth end-block; wherein the first and second coupling ends of the second rotary magnetron assembly are respectively connected to the third and fourth end-blocks, through respective vacuum seal arrangements.

Example 9 includes the apparatus of Example 8, wherein the RF matching network is operatively coupled to the first rotary magnetron assembly through the first end-block to provide the RF power signals to the first rotary magnetron assembly.

Example 10 includes the apparatus of Example 9, further comprising a first electrical component coupled between the first end-block and the fourth end-block, such that the RF power signals are simultaneously delivered to the second rotary magnetron assembly.

Example 11 includes the apparatus of Example 10, further comprising a second electrical component coupled between the third end-block and a ground connection within the vacuum chamber.

Example 12 includes the apparatus of any of Examples 1-11, further comprising a set of low frequency or direct current (DC) power supplies, located outside of the vacuum chamber, and respectively coupled to each of the plurality of electrodes.

Example 13 includes the apparatus of Example 12, further comprising a set of filters respectively coupled to outputs of the set of low frequency or DC power supplies.

Example 14 includes an apparatus, comprising: a vacuum chamber configured to produce a substantially atmospheric vacuum environment for plasma processing; a RF power supply located outside of the vacuum chamber; an RF matching network operatively coupled to the RF power supply; a set of low frequency or DC power supplies located outside of the vacuum chamber, and a plurality of magnetron electrodes rotatably mounted within the vacuum chamber, the plurality of magnetron electrodes configured to receive RF power signals from the RF power supply through the RF matching network, and low frequency or DC power signals through the low frequency or DC power supplies; wherein the RF power signals, and the low frequency or DC power signals, are simultaneously delivered to the plurality of magnetron electrodes during a sputtering operation; wherein for coupling the RF power signals, and the low frequency or DC power signals, the plurality of magnetron electrodes and a set of electrical components are operative to manage inductive and capacitive reactance for coupling the RF power signals to provide optimized plasma coupling during the sputtering operation.

Example 15 includes the apparatus of Example 14, wherein the plurality of magnetron electrodes comprise a first rotary magnetron assembly and a second rotary magnetron assembly, mounted in series within the vacuum chamber.

Example 16 includes the apparatus of Example 15, wherein: the first rotary magnetron assembly includes a first coupling end and an opposing second coupling end; and the second rotary magnetron assembly includes a first coupling end and an opposing second coupling end.

Example 17 includes the apparatus of Example 16, further comprising: a first coupling device in electrical communication with the first coupling end of the first rotary magnetron assembly; a second coupling device in electrical communication with the second coupling end of the first rotary magnetron assembly; a third coupling device in electrical communication with the first coupling end of the second rotary magnetron assembly; and a fourth coupling device in electrical communication with the second coupling end of the second rotary magnetron assembly.

Example 18 includes the apparatus of Example 17, wherein the RF matching network is operatively coupled to the first rotary magnetron assembly through the first coupling device to provide the RF power signals to the first rotary magnetron assembly.

Example 19 includes the apparatus of Example 18, wherein the low frequency or DC power supplies comprise: a first low frequency or DC power supply in operative communication with the first rotary magnetron assembly through the second coupling device; and a second low frequency or DC power supply in operative communication with the second rotary magnetron assembly through the fourth coupling device.

Example 20 includes the apparatus of Example 19, further comprising: a first lowpass filter coupled to an output of the first low frequency or DC power supply; and a second lowpass filter coupled to an output of the second low frequency or DC power supply.

From the foregoing, it will be appreciated that, although specific embodiments have been described herein for purposes of illustration, various modifications may be made without deviating from the scope of the disclosure. Thus, the described embodiments are to be considered in all respects only as illustrative and not restrictive. In addition, all changes that come within the meaning and range of equivalency of the claims are to be embraced within their scope.

What is claimed is:

1. An apparatus, comprising:
   a vacuum chamber configured to produce a substantially atmospheric vacuum environment for plasma processing;
   a radio frequency (RF) power supply located outside of the vacuum chamber;
   an RF matching network operatively coupled to the RF power supply; and a plurality of magnetrons mounted within the vacuum chamber, the plurality of magnetrons configured to receive RF power signals from the RF power supply through the RF matching network;

wherein the RF power signals are simultaneously delivered to the plurality of magnetrons during a sputtering operation;

wherein the plurality of magnetrons and a set of electrical components are operative to manage inductive and capacitive reactance for coupling the RF power signals to provide more desirable plasma coupling during the sputtering operation.

2. The apparatus of claim 1, wherein the plurality of magnetrons each comprise a rotary magnetron assembly that includes a rotatable target cylinder that houses a magnetron.

3. The apparatus of claim 1, wherein the plurality of magnetrons each comprise a planar magnetron assembly.

4. The apparatus of claim 1, wherein the plurality of magnetrons comprise a first rotary magnetron assembly and a second rotary magnetron assembly, mounted in series within the vacuum chamber.

5. The apparatus of claim 4, wherein:
the first rotary magnetron assembly includes a first coupling end and an opposing second coupling end; and
the second rotary magnetron assembly includes a first coupling end and an opposing second coupling end.

6. The apparatus of claim 5, further comprising:
a first coupling device in electrical communication with the first coupling end of the first rotary magnetron assembly;
a second coupling device in electrical communication with the second coupling end of the first rotary magnetron assembly;
a third coupling device in electrical communication with the first coupling end of the second rotary magnetron assembly; and
a fourth coupling device in electrical communication with the second coupling end of the second rotary magnetron assembly.

7. The apparatus of claim 6, wherein:
the first coupling device comprises a first end-block, and the second coupling device comprises a second end-block;
wherein the first and second coupling ends of the first rotary magnetron assembly are respectively connected to the first and second end-blocks, through respective vacuum seal arrangements.

8. The apparatus of claim 7, wherein:
the third coupling device comprises a third end-block, and the fourth coupling device comprises a fourth end-block;
wherein the first and second coupling ends of the second rotary magnetron assembly are respectively connected to the third and fourth end-blocks, through respective vacuum seal arrangements.

9. The apparatus of claim 8, wherein the RF matching network is operatively coupled to the first rotary magnetron assembly through the first end-block to provide the RF power signals to the first rotary magnetron assembly.

10. The apparatus of claim 9, further comprising a first electrical component coupled between the second end-block and the fourth end-block, such that the RF power signals are simultaneously delivered to the second rotary magnetron assembly.

11. The apparatus of claim 10, further comprising a second electrical component coupled between the third end-block and a ground connection within the vacuum chamber.

12. The apparatus of claim 1, further comprising a set of low frequency or direct current (DC) power supplies, located outside of the vacuum chamber, and respectively coupled to each of the plurality of magnetrons.

13. The apparatus of claim 12, further comprising a set of filters respectively coupled to outputs of the set of low frequency or DC power supplies.

14. An apparatus, comprising:
a vacuum chamber configured to produce a substantially atmospheric vacuum environment for plasma processing;
a radio frequency (RF) power supply located outside of the vacuum chamber;
an RF matching network operatively coupled to the RF power supply;
a set of low frequency or direct current (DC) power supplies located outside of the vacuum chamber; and
a plurality of magnetron electrodes rotatably mounted within the vacuum chamber, the plurality of magnetron electrodes configured to receive RF power signals from the RF power supply through the RF matching network, and low frequency or DC power signals through the low frequency or DC power supplies;
wherein the RF power signals, and the low frequency or DC power signals, are simultaneously delivered to the plurality of magnetron electrodes during a sputtering operation;
wherein for coupling the RF power signals, and the low frequency or DC power signals, the plurality of magnetron electrodes and a set of electrical components are operative to manage inductive and capacitive reactance for coupling the RF power signals to provide optimized plasma coupling during the sputtering operation.

15. The apparatus of claim 14, wherein the plurality of magnetron electrodes comprise a first rotary magnetron assembly and a second rotary magnetron assembly, mounted in series within the vacuum chamber.

16. The apparatus of claim 15, wherein:
the first rotary magnetron assembly includes a first coupling end and an opposing second coupling end; and
the second rotary magnetron assembly includes a first coupling end and an opposing second coupling end.

17. The apparatus of claim 16, further comprising:
a first coupling device in electrical communication with the first coupling end of the first rotary magnetron assembly;
a second coupling device in electrical communication with the second coupling end of the first rotary magnetron assembly;
a third coupling device in electrical communication with the first coupling end of the second rotary magnetron assembly; and
a fourth coupling device in electrical communication with the second coupling end of the second rotary magnetron assembly.

18. The apparatus of claim 17, wherein the RF matching network is operatively coupled to the first rotary magnetron assembly through the first coupling device to provide the RF power signals to the first rotary magnetron assembly.

19. The apparatus of claim 18, wherein the low frequency or DC power supplies comprise:
a first low frequency or DC power supply in operative communication with the first rotary magnetron assembly through the second coupling device; and
a second low frequency or DC power supply in operative communication with the second rotary magnetron assembly through the fourth coupling device.

20. The apparatus of claim 19, further comprising:
a first lowpass filter coupled to an output of the first low frequency or DC power supply; and
a second lowpass filter coupled to an output of the second low frequency or DC power supply.

\* \* \* \* \*